United States Patent
Dan et al.

(10) Patent No.: US 12,265,769 B2
(45) Date of Patent: *Apr. 1, 2025

(54) COLLATERAL CORRELATED REGRESSION IN VERSION CONTROL REPOSITORY

(71) Applicant: International Business Machines Corporation, Armonk, NY (US)

(72) Inventors: Kousik Dan, Bangalore (IN); Sandeep Korrapati, Bangalore (IN); Joji P George, Bangalore (IN); Amarnath Thulabanthula, Bangalore (IN); Nitish Jindal, Bangalore (IN); Madhuri Soma, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/453,415

(22) Filed: Aug. 22, 2023

(65) Prior Publication Data
US 2023/0394213 A1    Dec. 7, 2023

Related U.S. Application Data

(63) Continuation of application No. 17/347,680, filed on Jun. 15, 2021, now Pat. No. 11,790,143.

(51) Int. Cl.
*G06F 30/333*    (2020.01)
*G06F 16/21*    (2019.01)
(Continued)

(52) U.S. Cl.
CPC ......... *G06F 30/333* (2020.01); *G06F 16/211* (2019.01); *G06F 30/327* (2020.01); *G06N 20/00* (2019.01)

(58) Field of Classification Search
CPC .... G06F 30/333; G06F 16/211; G06F 30/327; G06F 30/27; G06N 20/00
See application file for complete search history.

(56) References Cited

U.S. PATENT DOCUMENTS 6,341,291 B1 * 1/2002 Bentley ................... G06F 16/21
                                                      707/999.203
7,155,375 B1 * 12/2006 Rimoldi .................. G06F 30/00
                                                      703/2

(Continued)

FOREIGN PATENT DOCUMENTS

WO    WO-2019167081 A1 * 9/2019

OTHER PUBLICATIONS

Ghosh, A. Raghunathan and N. K. Jha, "A design-for-testability technique for register-transfer level circuits using control/data flow extraction," in IEEE Transactions on Computer-Aided Design of Integrated Circuits and Systems, vol. 17, No. 8, pp. 706-723, Aug. 1998 (Year: 1998).*

(Continued)

*Primary Examiner* — Stacy Whitmore
(74) *Attorney, Agent, or Firm* — Aaron N. Pontikos

(57) ABSTRACT

A method, system, and computer program product for parallel regression to bypass regression process interruption are provided. The method identifies an RTL design. The RTL design is converted into a control data flow graph having a plurality of nodes and a plurality of arcs. A mapping table is generated with a machine learning database from a set of test cases based on the control data flow graph. The method selectively calls one or more test cases of the set of test cases to merge a branch to a main repository to bypass a portion of a regression process.

18 Claims, 6 Drawing Sheets

(51) Int. Cl.
*G06F 30/327* (2020.01)
*G06N 20/00* (2019.01)

(56) References Cited

U.S. PATENT DOCUMENTS

| | | | | |
|---|---|---|---|---|
| 7,178,063 | B1* | 2/2007 | Smith | G06F 11/3688 |
| | | | | 717/124 |
| 7,194,489 | B2* | 3/2007 | Bentley | G06F 16/1734 |
| | | | | 707/999.203 |
| 7,305,650 | B1* | 12/2007 | Jensen | G06F 30/327 |
| | | | | 716/108 |
| 8,271,920 | B2* | 9/2012 | Cho | G06F 30/39 |
| | | | | 716/110 |
| 8,413,088 | B1 | 4/2013 | Armbruster | |
| 8,924,938 | B2 | 12/2014 | Chang | |
| 9,032,369 | B2 | 5/2015 | Balakrishnan | |
| 9,256,419 | B2 | 2/2016 | Mannarswamy | |
| 9,286,188 | B1 | 3/2016 | Chopra | |
| 10,467,250 | B2* | 11/2019 | Baird | G06F 16/2365 |
| 10,761,813 | B1* | 9/2020 | Echeverria | G06F 8/34 |
| 10,839,132 | B2 | 11/2020 | Dan | |
| 10,984,150 | B2* | 4/2021 | Maddukuri | G06F 30/18 |
| 11,226,889 | B2* | 1/2022 | Quemy | G06F 11/3692 |
| 11,645,441 | B1* | 5/2023 | Jiang | G06F 30/398 |
| | | | | 716/108 |
| 11,790,143 | B2* | 10/2023 | Dan | G06F 16/211 |
| | | | | 716/104 |
| 2008/0184180 | A1* | 7/2008 | Takenaka | G06F 30/327 |
| | | | | 716/108 |
| 2011/0154110 | A1* | 6/2011 | Letz | G06F 30/3308 |
| | | | | 714/33 |
| 2012/0144376 | A1* | 6/2012 | Van Eijndhoven | G06F 8/456 |
| | | | | 717/146 |
| 2014/0282411 | A1* | 9/2014 | Liemandt | G06F 11/3672 |
| | | | | 717/124 |
| 2017/0017747 | A1* | 1/2017 | Cho | G06F 30/30 |
| 2019/0042513 | A1* | 2/2019 | Fleming, Jr. | G06F 9/30145 |
| 2020/0192660 | A1 | 6/2020 | Ananthanarayanan | |
| 2020/0265123 | A1 | 8/2020 | Dan | |
| 2020/0364042 | A1 | 11/2020 | Wuensche | |
| 2020/0394128 | A1* | 12/2020 | Hicks | G06F 11/3692 |
| 2021/0081305 | A1* | 3/2021 | Baghdadi | G06F 11/3466 |

OTHER PUBLICATIONS

Efficient Workflow to Promote Patches in a Multi-Level Version Control Hardware Design Repository, ip.com, IP.com No. IPCOM000264246D, IP.com Electronic Publication Date: Nov. 25, 2020, 7 pages.

List of IBM Patents and Patent Applications to be Treated as Related (2023) 2 pgs.

Mell et al., "The NIST Definition of Cloud Computing", Recommendations of the National Institute of Standards and Technology, Special Publication 800-145, Sep. 2011, 7 pages.

U.S. Appl. No. 17/347,680 Notices of References, mailed Jun. 1, 2023, 2 pgs.

Al-Sabbagh et al., "Predicting Test Case Verdicts Using Textual Analysis of Committed Code Churns", 16 pps., University of Gothenburg, Computer Science and Engineering Department, Gothenburg, Swededn, <https://ceur-ws.org/Vol-2476/paper7.pdf>.

Marchese, "Formal verification enables Agile RTL development", Posted: Jan. 13, 2014, 3 pps., © 2024 The Curation Company, Tech Design Forum <https://www.techdesignsforums.com/practice/technique/formal-verification-enables-agile-rtl-development/>.

Normann, "Test Case Selection Based on Code Changes", Nov. 2019, 28 pps., Uppsala Universitet, Department of Information Technology, <https://uu.diva-portal.org/smash/get/diva2:1371200/FULLTEXT01.pdf>.

* cited by examiner

COLLATERAL CORRELATED REGRESSION IN VERSION CONTROL REPOSITORY

BACKGROUND

Digital circuit design projects are often performed by multiple designers working in collaboration. Regression processes may be applied to collaborative work in digital circuit design projects. Regression processes often proceed in a stable manner in digital circuit design processes. Some otherwise stable regression processes can be interrupted during branching functions. Interruptions in stable regression processes can cause issues or complicate collaboration by multiple designers.

SUMMARY

According to an embodiment described herein, a computer-implemented method for a parallel regression to bypass a regression process interruption is provided. The method identifies a register-transfer-level (RTL) design. The RTL design is converted into a control data flow graph having a plurality of nodes and a plurality of arcs. A mapping table is generated with a machine learning database from a set of test cases based on the control data flow graph. The method selectively calls one or more test cases of the set of test cases to merge a branch to a main repository to bypass a portion of a regression process.

According to an embodiment described herein, a system for parallel regression to bypass regression process interruption is provided. The system includes one or more processors and a computer-readable storage medium, coupled to the one or more processors, storing program instructions that, when executed by the one or more processors, cause the one or more processors to perform operations. The operations identify a register-transfer-level (RTL) design. The RTL design is converted into a control data flow graph having a plurality of nodes and a plurality of arcs. A mapping table is generated with a machine learning database from a set of test cases based on the control data flow graph. The operations selectively call one or more test cases of the set of test cases to merge a branch to a main repository to bypass a portion of a regression process.

According to an embodiment described herein, a computer program product for parallel regression to bypass regression process interruption is provided. The computer program product includes a computer-readable storage medium having program instructions embodied therewith, the program instructions being executable by one or more processors to cause the one or more processors to identify a register-transfer-level (RTL) design. The RTL design is converted into a control data flow graph having a plurality of nodes and a plurality of arcs. A mapping table is generated with a machine learning database from a set of test cases based on the control data flow graph. The computer program product selectively calls one or more test cases of the set of test cases to merge a branch to a main repository to bypass a portion of a regression process.

DETAILED DESCRIPTION

The present disclosure relates generally to methods for parallel regression to bypass regression process interruption. More particularly, but not exclusively, embodiments of the present disclosure relate to a computer-implemented method for collateral correlated regression processes against RTL modification of side branch models. The present disclosure relates further to a related system for parallel regression processes, and a computer program product for operating such a system.

Digital circuit design projects are often performed by multiple designers working in collaboration using regression processes. Some otherwise stable regression processes can be interrupted during branching functions. For example, merging a faulty side branch with one or more new RTL additions or modifications into a main model branch in a version control repository can cause interruptions in the design process. Merging such faulty side branches can lead to scenarios where multiple designers are working on the same main branch model. During this contemporaneous work, attempting to merge respective branches into the main model branch can degrade ongoing regression processes of multiple layers of RTL design verification. For example, degradation can occur in unit, element, and chip design verification processes.

Embodiments of the present disclosure create a parallel regression process. The parallel regression process is performed for selective tests temporarily and in an on-demand basis. In some embodiments, the parallel regression process bypasses regression interruption after merging. Embodiments of the present disclosure bypass merging of bugs contained in side branch models into main branch models. In some embodiments, bypassing unnecessary regression processes enables following issue debugging and bug ticket generation capable of addressing side branch model bugs.

Some embodiments of the concepts described herein may take the form of a system or a computer program product. For example, a computer program product may store program instructions that, when executed by one or more processors of a computing system, cause the computing system to perform operations described above with respect to the computer-implemented method. By way of further example, the system may comprise components, such as processors and computer-readable storage media. The computer-readable storage media may interact with other components of the system to cause the system to execute program instructions comprising operations of the computer-implemented method, described herein. For the purpose of this description, a computer-usable or computer-readable medium may be any apparatus that may contain means for storing, communicating, propagating, or transporting the program for use, by, or in connection with, the instruction execution system, apparatus, or device.

Figure 1:
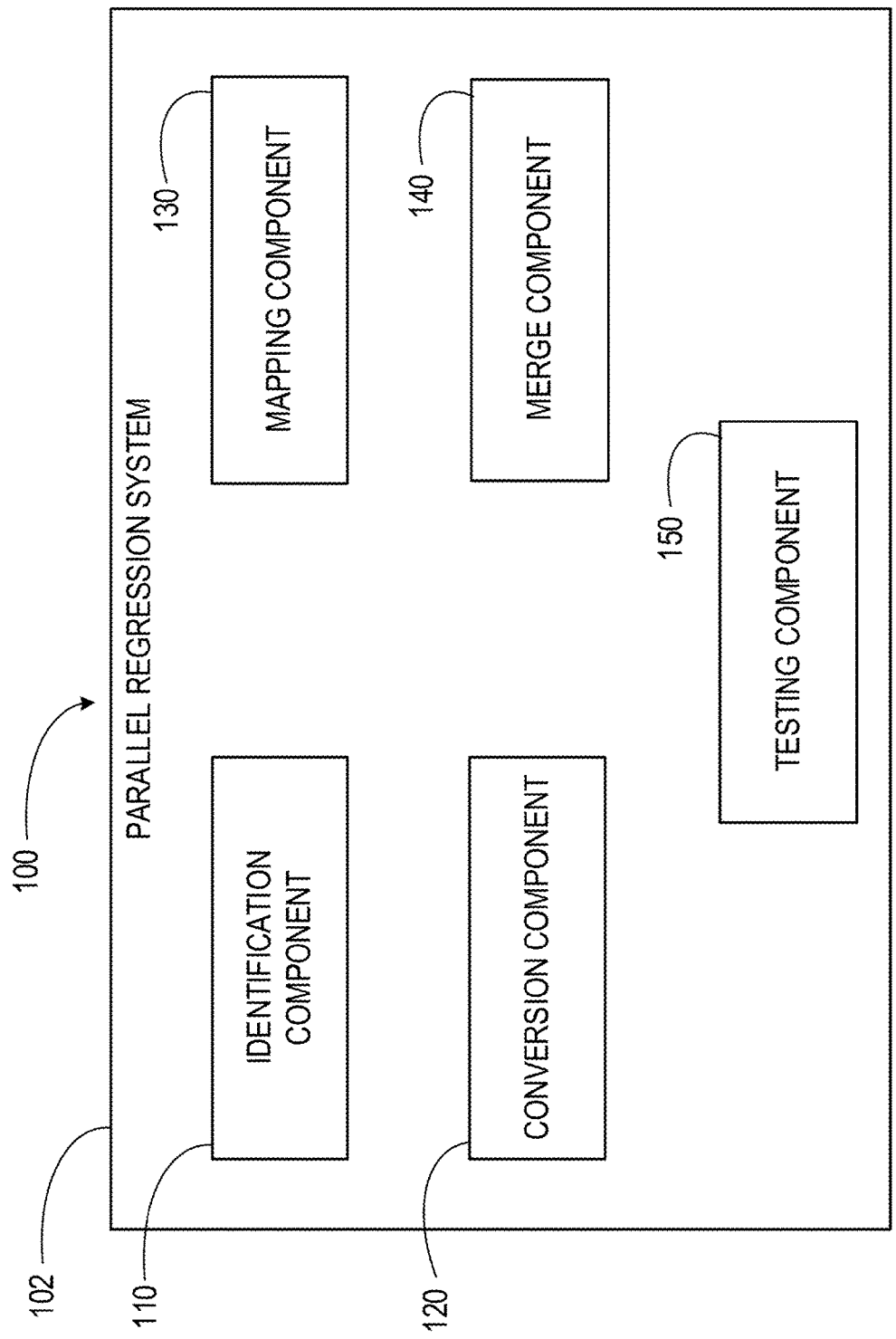
FIG. 1 depicts a block diagram of a computing environment for implementing concepts and computer-based methods, according to at least one embodiment.

Referring now to FIG. 1, a block diagram of an example computing environment 100 is shown. The present disclosure may be implemented within the example computing environment 100. In some embodiments, the computing environment 100 may be included within or embodied by a computer system, described below. The computing environment 100 may include a parallel regression system 102. The parallel regression system 102 may comprise an identification component 110, a conversion component 120, a mapping component 130, a merge component 140, and a testing component 150. The identification component 110 identifies register-transfer-level (RTL) designs to be subject to regression processes. The conversion component 120 converts RTL designs into control data flow graphs. The mapping component 130 generates mapping tables based on control data flow graphs and sets of test cases. The merge component 140 selectively calls one or more test cases of the sets of test cases. The testing component 150 selects and determines efficiency for test cases. Although described with distinct components, it should be understood that, in at least some embodiments, components may be combined or divided, and/or additional components may be added without departing from the scope of the present disclosure.

Figure 2:
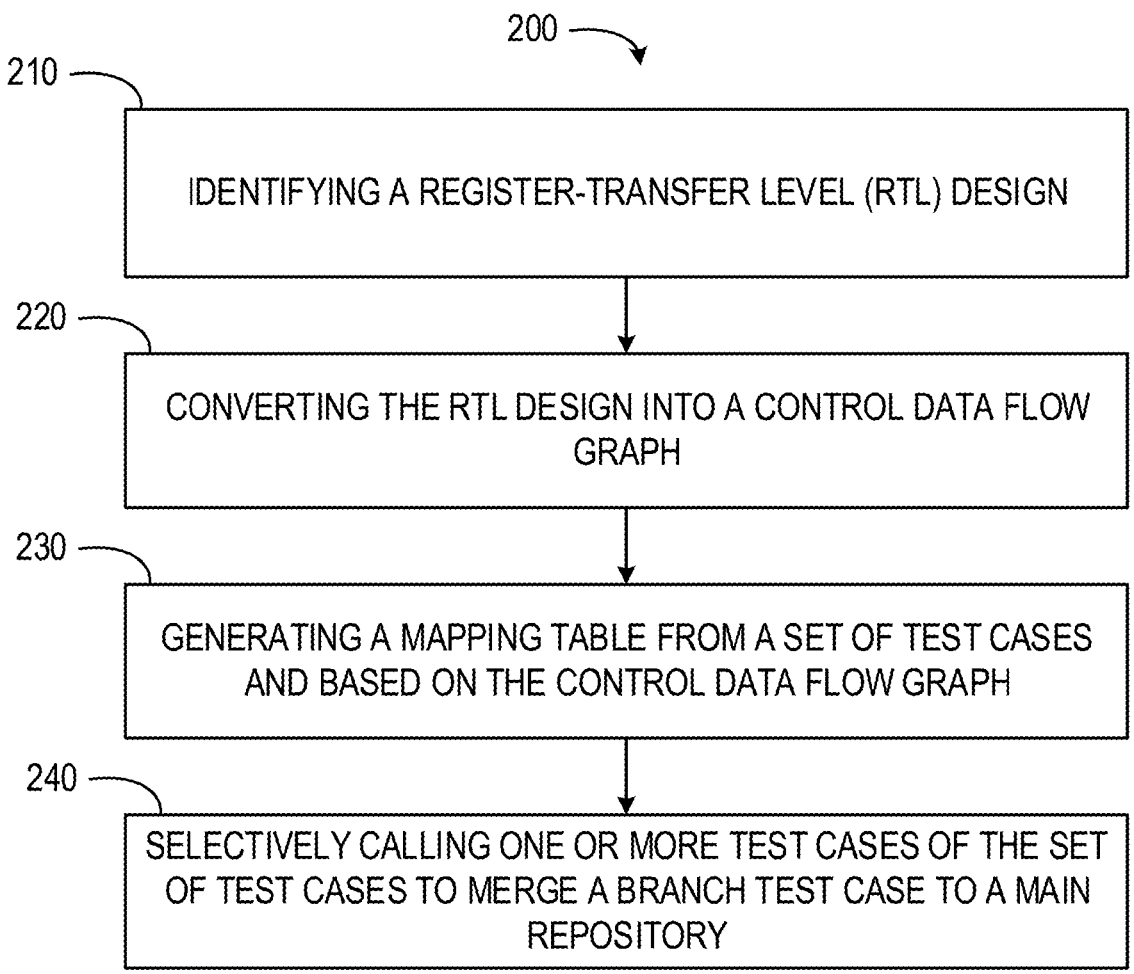
FIG. 2 depicts a flow diagram of a computer-implemented method for parallel regression to bypass regression process interruption, according to at least one embodiment.

Referring now to FIG. 2, a flow diagram of a computer-implemented method 200 is shown. The computer-implemented method 200 is a method for parallel regression to bypass regression process interruption. In some embodiments, the computer-implemented method 200 may be performed by one or more components of the computing environment 100, as described in more detail below.

At operation 210, the identification component 110 identifies an RTL design. The RTL design may be a hardware design, such as an electronic circuit design. The RTL design may be identified by transmitting or providing access to the RTL design. In some embodiments, the RTL design may be established as a project available for access by the identification component 110. The RTL design may be a digital chip design. The digital chip design may be accessible for collaborative work by a number of designers. Each designer with access to the RTL design may create changes or modifications to the RTL design. Designers may be able to execute or cause execution of regression processes on the RTL design to verify one or more elements of the RTL design, changes, or modifications. Regression verification processes may include verification of a unit, an element, a chip, or any other suitable aspects of the RTL design.

At operation 220, the conversion component 120 converts the RTL design into a control data flow graph. In some embodiments, the control data flow graph has a plurality of nodes and a plurality of arcs. In some embodiments, each node of the plurality of nodes is a logical expression. In some embodiments, each arc of the plurality of arcs in the control data flow graph is a signal to at least one node of the plurality of nodes. The conversion component 120 may convert the RTL design into the control data flow graph using a register-transfer level of a hardware description language. The hardware description language may describe aspects, functions, inputs, outputs, interrelations, and other characteristics of elements or components of the RTL design. The conversion component 120 may convert individual or combined characteristics or elements of the RTL design into nodes and arcs of the control data flow graph.

In some embodiments, the conversion component 120 converts the RTL design into the control data flow graph by RTL design aspects. The conversion component 120 may convert a first portion of the design aspects into nodes and a second portion of the design aspects into arc s extending between two or more nodes. Nodes may refer to signals of an RTL design, such as an output signal of a function block or circuit. Each node may be associated with one or more node properties. Node properties may include total node weight, node in weight, node out weight, and node improbability rating. The total node weight may be a total number of arcs into or out of a node. The node weight in may be a total number of arcs with a directional arrow pointing into a node. The node out weight may be a total number of arcs out of a node. The node improbability rating may be an uncertainty that a node value will be changed when a circuit with the RTL design is in operation. The improbability rating may be calculated as a value for each node. The improbability rating may be calculated to depend on an improbability rating of inputs to the node and multiplying factors that depend on a function of a hardware component producing the signal of the node. In some embodiments, the function of the hardware component, such as the function generating the signal, is a logical expression used to calculate the improbability rating. In such instances, each input to the node may be multiplied by a factor and then added together to produce an improbability rating.

The logical expressions are representations of each of the nodes. The logical expression may be an expression for hardware corresponding to nodes performing operations on inputs to the node. In some instances, the logical expressions include node signals and logical operators.

Arcs may refer to transitions between nodes. The transitions may be represented by directional arrows extending between a first node and a second or subsequent node. Arcs or transitions may be associated with transition properties. Transition properties may include a transition path weight.

At operation 230, the mapping component 130 generates a mapping table. The mapping table may be generated with a machine learning database, a machine learning algorithm, and a set of machine learning algorithms. The mapping table may be generated from or using a set of test cases. In some embodiments, the mapping table is generated from the set of test cases and based on the control data flow graph.

In some embodiments, the mapping table is generated by parsing the set of test cases in regressions through the control data flow graph. Each test case may be parsed in regressions. The mapping table may indicate each node and arc traversed by each test case of the set of test cases.

In some embodiments, the operations 220 and 230 are used in a machine learning training phase to generate a machine learning database or machine learning model for the RTL design.

At operation 240, the merge component 140 selectively calls one or more test cases of the set of test cases. The merge component 140 may merge a branch test case to a main repository. In some embodiments, the merge component 140 uses known tools such as Dadb. The merge component 140 may identify logic cones which are hit in the execution of a particular test case. Signals and arcs in the logic cone may be noted in the mapping table and mapped to individual control data flow graphs associated with the RTL design or a specific test case of the RTL design. The merge component 140 may cooperate with the mapping component 130, using output or trace files of simulation runs for the test cases. In such instances, the merge component 140 may identify data of which signals or nodes have been toggled or which signals or nodes have been scrutinized in a particular test case.

In embodiments where a test case contains an incremental change to existing logic, the merge component 140 cooperates with the conversion component 120 to generate a control flow graph for the side branch associated with the test case. The control flow graph is generated on the files that have been changed to generate a modified control flow graph. The modified control flow graph may be provided to the machine learning database or machine learning model produced from operations 220 and 230. The nodes and arcs of the modified control flow graph may be mapped to the nodes and arcs of the control flow graph for the RTL design in the machine learning model. The merge component 140 may cooperate with other components of the parallel regression system 102 to identify modified nodes or arcs indicating the incremental change between the modified control flow graph and the RTL design control flow graph. The merge component 140 then determines test cases (e.g., identified test cases) from the mapping table which have at least a portion of the modified nodes or arcs. The merge component 140 may then use the identified test cases to regress the side branch. If all of the identified test cases pass, the merge component 140 may merge the branch test case. In some instances, the merge component 140 enables a user to merge the test branch where all of the identified test cases pass.

In embodiments where the test case or side branch contains new logic, the merge component 140 cooperates with the mapping component 130 to map the new logic to existing nodes and arcs of the control flow graph of the RTL design and control flow graphs of the test cases. The new logic may be associated with new nodes and new arcs. Where the new nodes and new arcs occur in one or more test cases (e.g., identified test cases), the merge component 140 may use the identified test cases to regress the side branch and merge the side branch where all of the identified test cases pass. Where the new nodes and new arcs occur in none of the test cases, the merge component 140 may allow the test case or side branch to be merged where the test case or side branch with the new logic passes.

Figure 3:
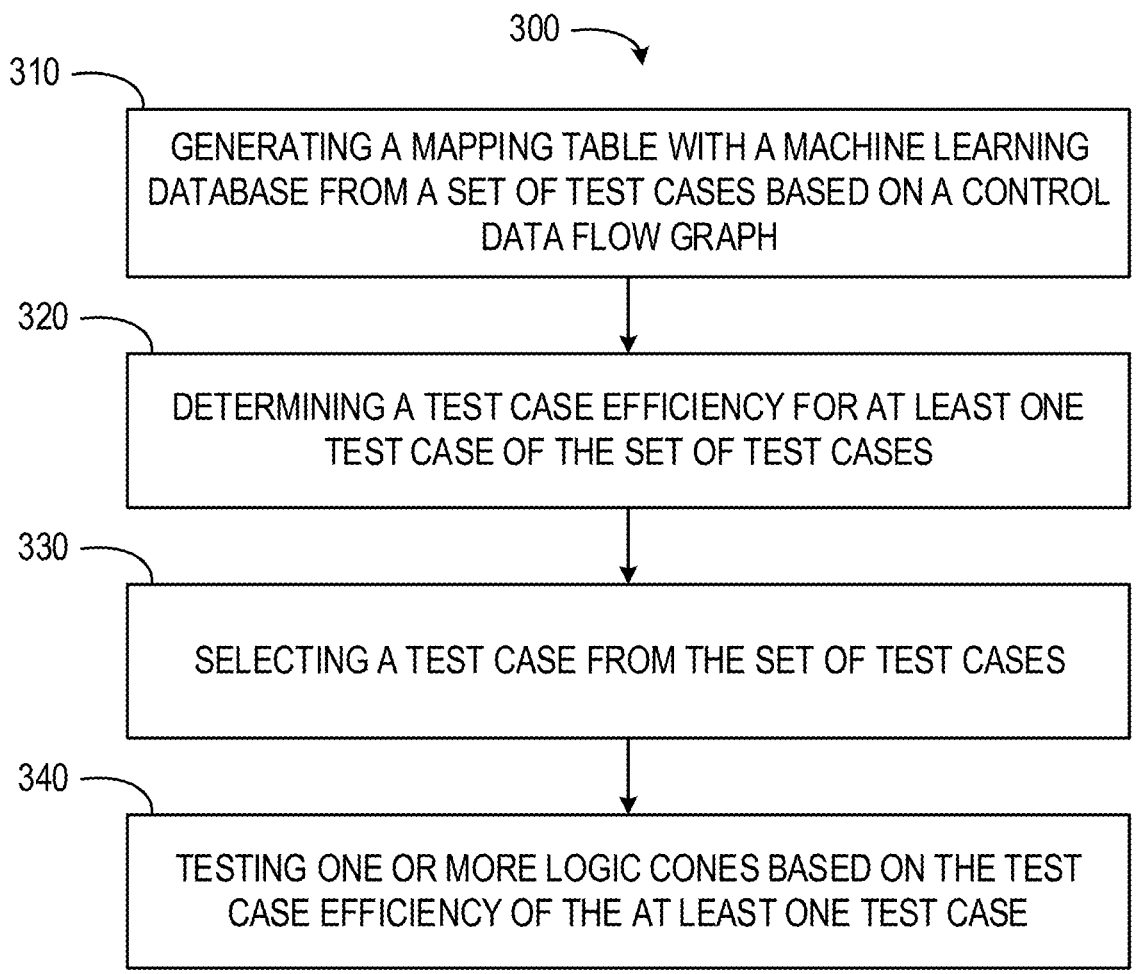
FIG. 3 depicts a flow diagram of a computer-implemented method for parallel regression to bypass regression process interruption, according to at least one embodiment.

FIG. 3 shows a flow diagram of an embodiment of a computer-implemented method 300 for parallel regression to bypass regression process interruption. The method 300 may be performed by or within the computing environment 100. In some embodiments, the method 300 comprises or incorporates one or more operations of the method 200. In some instances, operations of the method 300 may be incorporated as part of or sub-operations of the method 200.

In operation 310, the mapping component 130 generates a mapping table with a machine learning database from a set of test cases and based on the control data flow graph. In some embodiments, the mapping component 130 generates the mapping table in a manner similar to or the same as described above with respect to operation 230.

In operation 320, the testing component 150 determines a test case efficiency for at least one test case of the set of test cases. The testing component 150 may determine the test case efficiency as a comparative level of efficiency of the set of test cases. In some instances, the testing component 150 uses machine learning to determine a comparatively more or most efficient test of the set of tests. In some instances, the testing component 150 generates an efficiency score for each test of the set of tests.

In operation 330, the testing component 150 selects a test case from the set of test cases. The test case may be selected based on the test case efficiency. The testing component 150 may select the test case with a highest level of efficiency of the set of tests. In some instances, the testing component 150 selects the test case with a highest efficiency score of the set of tests.

In operation 340, the testing component 150 test one or more logic cones based on the test case efficiency of the at least one test case.

Figure 4:
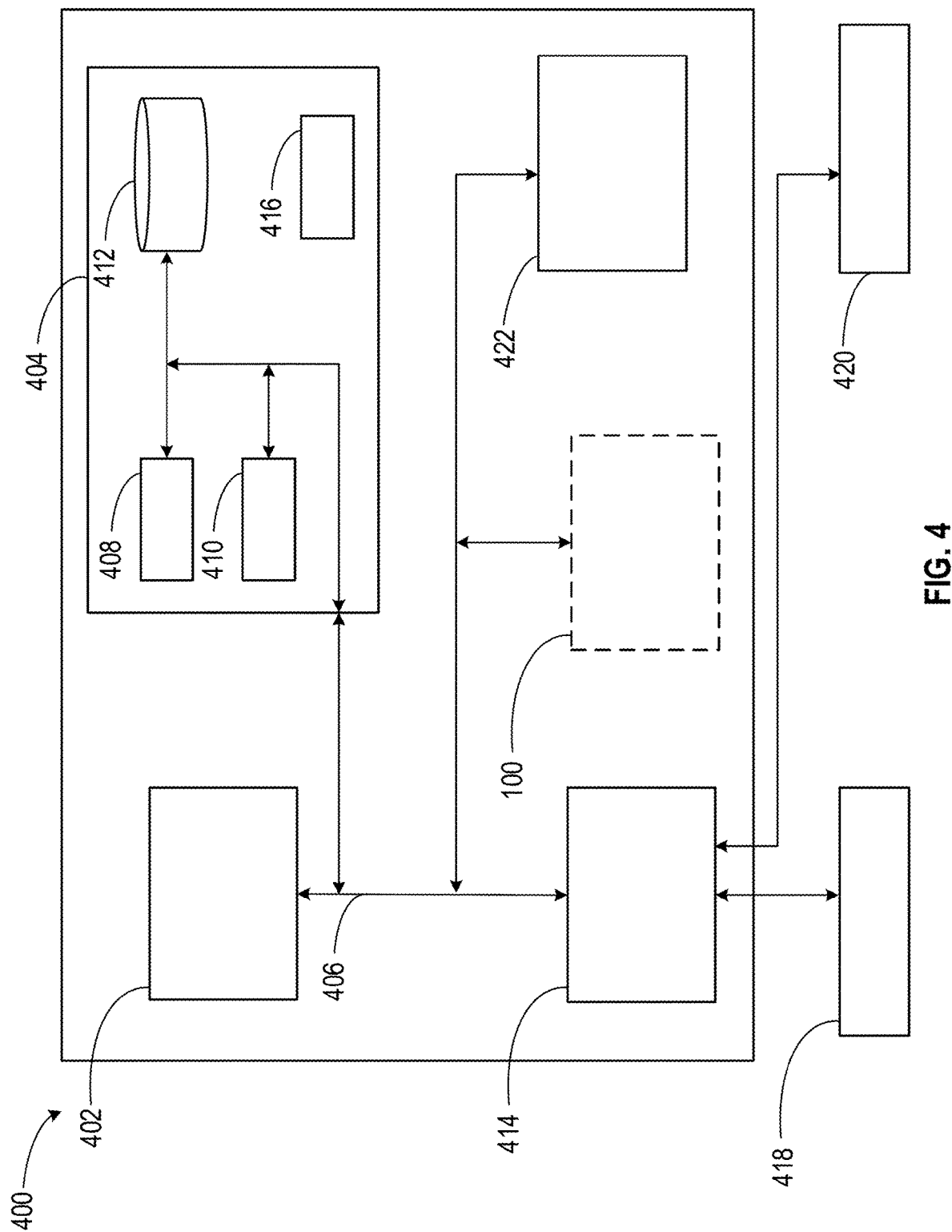
FIG. 4 depicts a block diagram of a computing system for parallel regression to bypass regression process interruption, according to at least one embodiment.

Embodiments of the present disclosure may be implemented together with virtually any type of computer, regardless if the platform is suitable for storing and/or executing program code. FIG. 4 shows, as an example, a computing system 400 (e.g., cloud computing system) suitable for executing program code related to the methods disclosed herein and for parallel regression to bypass regression process interruption.

The computing system 400 is only one example of a suitable computer system and is not intended to suggest any limitation as to the scope of use or functionality of embodiments of the present disclosure described herein, regardless, whether the computer system 400 is capable of being implemented and/or performing any of the functionality set forth hereinabove. In the computer system 400, there are components, which are operational with numerous other general purpose or special purpose computing system environments or configurations. Examples of well-known computing systems, environments, and/or configurations that may be suitable for use with computer system/server 400 include, but are not limited to, personal computer systems, server computer systems, thin clients, thick clients, hand-held or laptop devices, multiprocessor systems, microprocessor-based systems, set-top boxes, programmable consumer electronics, network PCs, minicomputer systems, mainframe computer systems, and distributed cloud computing environments that include any of the above systems or devices, and the like. Computer system/server 400 may be described in the general context of computer system-executable instructions, such as program modules, being executed by a computer system 400. Generally, program modules may include routines, programs, objects, components, logic, data structures, and so on that perform particular tasks or implement particular abstract data types. Computer system/server 400 may be practiced in distributed cloud computing environments where tasks are performed by remote processing devices that are linked through a communications network. In a distributed cloud computing environment, program modules may be located in both, local and remote computer system storage media, including memory storage devices.

As shown in the figure, computer system/server 400 is shown in the form of a general-purpose computing device. The components of computer system/server 400 may include, but are not limited to, one or more processors 402 (e.g., processing units), a system memory 404 (e.g., a computer-readable storage medium coupled to the one or more processors), and a bus 406 that couple various system components including system memory 404 to the processor 402. Bus 406 represents one or more of any of several types of bus structures, including a memory bus or memory controller, a peripheral bus, an accelerated graphics port, and a processor or local bus using any of a variety of bus architectures. By way of example, and not limiting, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. Computer system/server 400 typically includes a variety of computer system readable media. Such media may be any available media that is accessible by computer system/server 400, and it includes both, volatile and non-volatile media, removable and non-removable media.

The system memory 404 may include computer system readable media in the form of volatile memory, such as random-access memory (RAM) 408 and/or cache memory 410. Computer system/server 400 may further include other removable/non-removable, volatile/non-volatile computer system storage media. By way of example only, a storage system 412 may be provided for reading from and writing to a non-removable, non-volatile magnetic media (not shown and typically called a 'hard drive'). Although not shown, a magnetic disk drive for reading from and writing to a removable, non-volatile magnetic disk (e.g., a 'floppy disk'), and an optical disk drive for reading from or writing to a removable, non-volatile optical disk such as a CD-ROM, DVD-ROM or other optical media may be provided. In such instances, each can be connected to bus 406 by one or more data media interfaces. As will be further depicted and described below, the system memory 404 may include at least one program product having a set (e.g., at least one) of program modules that are configured to carry out the functions of embodiments of the present disclosure.

The program/utility, having a set (at least one) of program modules 416, may be stored in the system memory 404 by way of example, and not limiting, as well as an operating system, one or more application programs, other program modules, and program data. Program modules may include one or more of the conversion component 120, the mapping component 130, the merge component 140, and the testing component 150, which are illustrated in FIG. 1. Each of the operating systems, one or more application programs, other program modules, and program data or some combination thereof, may include an implementation of a networking environment. Program modules 416 generally carry out the functions and/or methodologies of embodiments of the present disclosure, as described herein.

The computer system/server 400 may also communicate with one or more external devices 418 such as a keyboard, a pointing device, a display 420, etc.; one or more devices that enable a user to interact with computer system/server 400; and/or any devices (e.g., network card, modem, etc.) that enable computer system/server 400 to communicate with one or more other computing devices. Such communication can occur via Input/Output (I/O) interfaces 414. Still yet, computer system/server 400 may communicate with one or more networks such as a local area network (LAN), a general wide area network (WAN), and/or a public network (e.g., the Internet) via network adapter 422. As depicted, network adapter 422 may communicate with the other components of computer system/server 400 via bus 406. It should be understood that, although not shown, other hardware and/or software components could be used in conjunction with computer system/server 400. Examples include, but are not limited to: microcode, device drivers, redundant processing units, external disk drive arrays, RAID systems, tape drives, and data archival storage systems, etc.

It is to be understood that although this disclosure includes a detailed description on cloud computing, implementation of the teachings recited herein are not limited to a cloud computing environment. Rather, embodiments of the present disclosure are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Service models may include software as a service (SaaS), platform as a service (PaaS), and infrastructure as a service (IaaS). In SaaS, the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings. In PaaS, the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations. In IaaS, the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment models may include private cloud, community cloud, public cloud, and hybrid cloud. In private cloud, the cloud infrastructure is operated solely for an organization. It may be managed by the organization or a third party and may exist on-premises or off-premises. In community cloud, the cloud infrastructure is shared by several organizations and supports specific community that has shared concerns (e.g., mission, security requirements, policy, and compliance considerations). It may be managed by the organizations or a third party that may exist on-premises or off-premises. In public cloud, the cloud infrastructure is made available to the general public or a large industry group and is owned by an organization selling cloud services. In hybrid cloud, the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling modularity, and semantic interoperability. At the heart of cloud computing is an infrastructure that includes a network of interconnected nodes.

Figure 5:
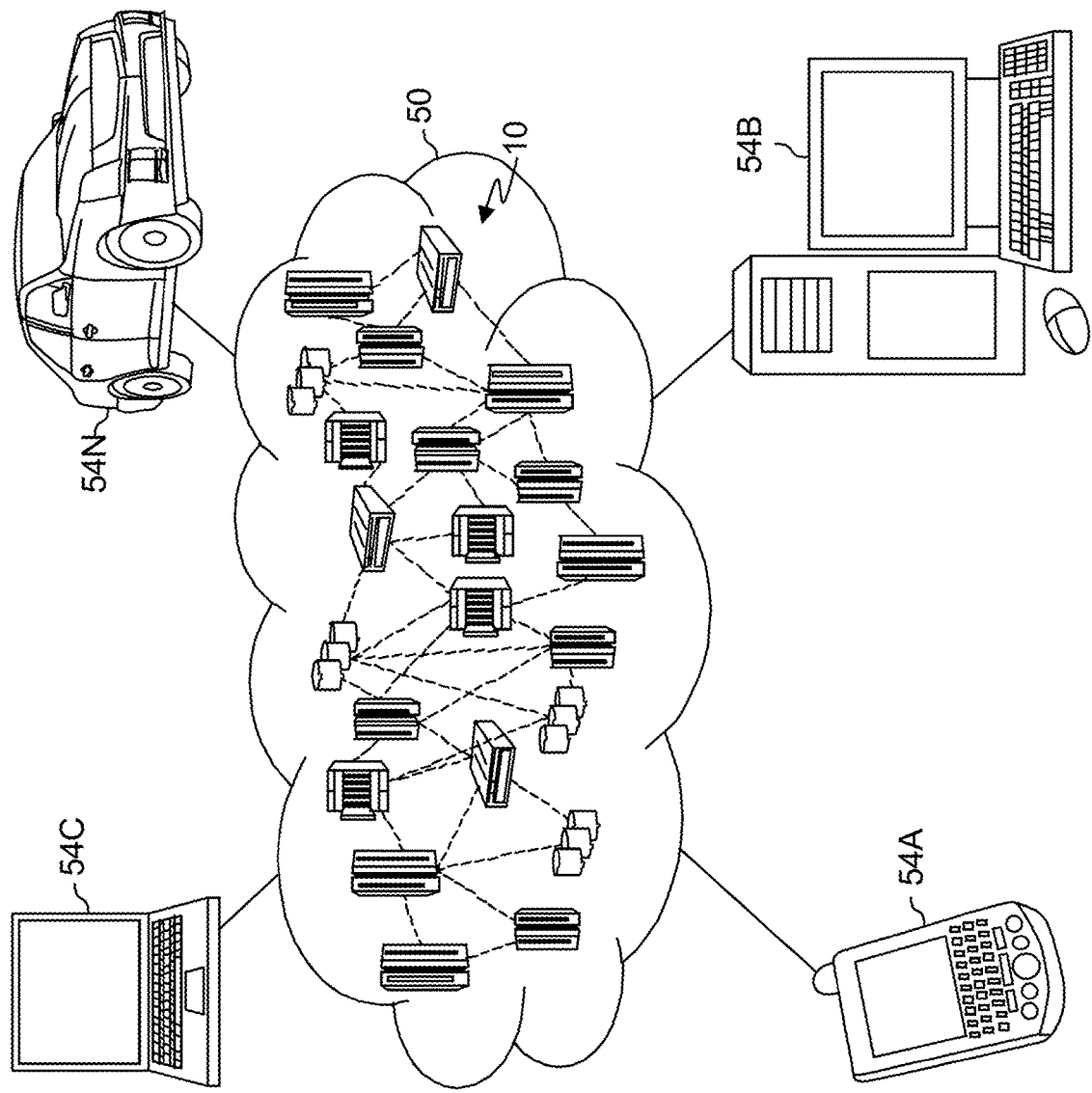
FIG. 5 is a schematic diagram of a cloud computing environment in which concepts of the present disclosure may be implemented, in accordance with an embodiment of the present disclosure.

Referring now to FIG. 5, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 5 are intended to be illustrative only and that computing nodes 10 and cloud computing environment can communicate with any type of computerized device over any type of network and/or network addressable connection (e.g., using a web browser).

Figure 6:
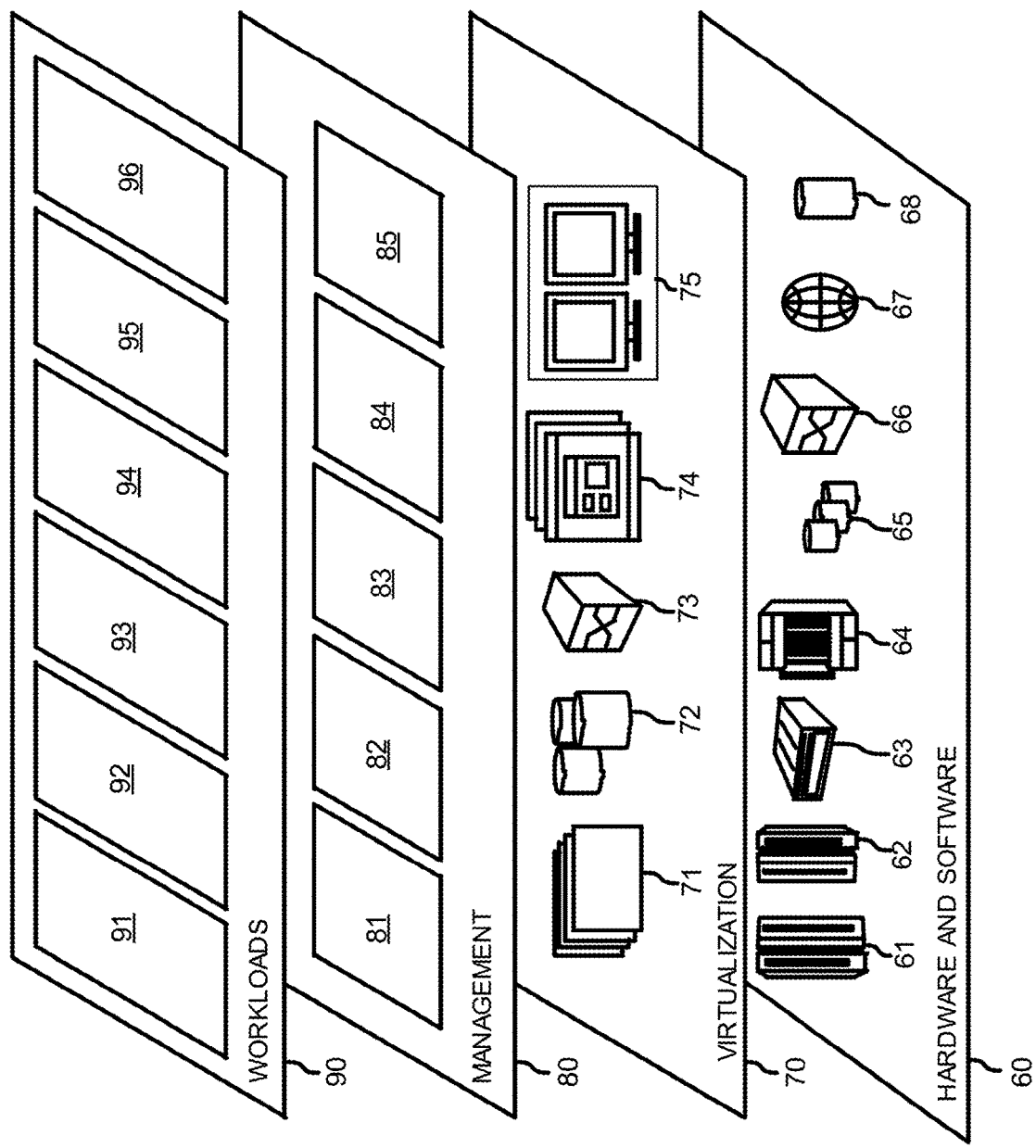
FIG. 6 is a diagram of model layers of a cloud computing environment in which concepts of the present disclosure may be implemented, in accordance with an embodiment of the present disclosure.

Referring now to FIG. 6, a set of functional abstraction layers provided by cloud computing environment 50 (FIG. 5) is shown. It should be understood in advance that the components, layers, and functions shown in FIG. 6 are intended to be illustrative only and embodiments of the disclosure are not limited thereto. As depicted, the following layers and corresponding functions are provided:

Hardware and software layer 60 includes hardware and software components. Examples of hardware components include: mainframes 61; RISC (Reduced Instruction Set Computer) architecture-based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and parallel regression processing 96.

Cloud models may include characteristics including on-demand self-service, broad network access, resource pooling, rapid elasticity, and measured service. In on-demand self-service a cloud consumer may unilaterally provision computing capabilities such as server time and network storage, as needed automatically without requiring human interaction with the service's provider. In broad network access, capabilities are available over a network and accessed through standard mechanisms that promote use by heterogeneous thin or thick client platforms (e.g., mobile phones, laptops, and PDAs). In resource pooling, the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter). In rapid elasticity, capabilities can be rapidly and elastically provisioned, in some cases automatically, to quickly scale out and rapidly released to quickly scale in. To the consumer, the capabilities available for provisioning often appear to be unlimited and can be purchased in any quantity at any time. In measured service, cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

The descriptions of the various embodiments of the present disclosure have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present invention may be embodied as a system, a method, and/or a computer program product. The computer program product may include a computer-readable storage medium (or media) having computer readable program instructions thereon for causing a processor to carry out aspects of the present invention.

The computer-readable storage medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disk read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer-readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer readable program instructions may execute entirely on the user's computer, partly on the user's computer as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatuses, or another device to cause a series of operational steps to be performed on the computer, other programmable apparatus or other device to produce a computer implemented process, such that the instructions which execute on the computer, other programmable apparatuses, or another device implement the functions/acts specified in the flowchart and/or block diagram block or blocks.

The flowcharts and/or block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the present disclosure. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present disclosure has been presented for purposes of illustration and description, but is not intended to be exhaustive or limited to the present disclosure in the form disclosed. Many modifications and variations will be apparent to those of ordinary skills in the art without departing from the scope of the present disclosure. The embodiments are chosen and described in order to explain the principles of the present disclosure and the practical application, and to enable others of ordinary skills in the art to understand the present disclosure for various embodiments with various modifications, as are suited to the particular use contemplated.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A parallel regression system comprising:
   a conversion component configured to convert registry transfer level (RTL) designs into one or more control data flow graphs;
   a mapping component configured to generate one or more mapping tables by parsing one or more sets of test cases in regressions through the one or more control data flow graphs; and
   a merge component configured to call one or more test cases from one or more sets of test cases included in the one or more mapping tables.

2. The system of claim 1 further comprising:
   an identification component configured to identify RTL designs.

3. The system of claim 1 wherein the conversion component is further configured to convert the RTL design into the control data flow graphs using a registry transfer level of a hardware description.

4. The system of claim 1 wherein the control data flow graph includes a plurality of nodes and a plurality of arcs.

5. The system of claim 4 wherein each node of the plurality of nodes is a logical expression.

6. The system of claim 4 wherein each arc is a signal to at least one of the plurality of nodes.

7. The system of claim 1 wherein the merge component is further configured to merge a branch test case to a main repository.

8. The system of claim 7 wherein the merge component merges the branch test case to the main repository in response to an identification of new logic in the test case.

9. The system of claim 7 wherein the merge component merges the branch test case to the main repository in response to an identification of new logic in a side branch.

10. The system of claim 1 further comprising a testing component is further configured to determine a test case efficiency for at least one test case of the set of test cases.

11. The system of claim 10 wherein the testing component is further configured to test one or more logic cones based on the test case efficiency of the at least one test case.

12. A parallel regression system comprising:
    a conversion component configured to convert registry transfer level (RTL) designs into control data flow graphs; and
    a merge component configured to call one or more test cases from one or more sets of test cases included in one or more mapping tables, wherein the merge component is further configured to merge, in response to an identification of new logic in a test case, a branch test case to a main repository to bypass a portion of a regression process.

13. The system of claim 12 wherein the mapping tables are based on the control data flow graphs and the one or more sets of test cases.

14. The system of claim 13 further comprising a mapping component configured to generate the one or more mapping tables by parsing the one or more sets of test cases in regressions through the control data flow graph.

15. The system of claim 12 further comprising a testing component configured to determine a test case efficiency for at least one test case of the set of test cases, wherein the testing component is further configured to test one or more logic cones based on the test case efficiency of the at least one test case.

16. A parallel regression system comprising:
    a conversion component configured to convert registry transfer level (RTL) designs into control data flow graphs; and
    a merge component configured to call one or more test cases from one or more sets of test cases included in one or more mapping tables, wherein the merge component is further configured to merge, in response to an identification of new logic in a side branch, a branch test case to a main repository to bypass a portion of a regression process.

17. The system of claim 16 further comprising a mapping component configured to generate the one or more mapping tables by parsing the one or more sets of test cases in regressions through the control data flow graph.

18. The system of claim 16 further comprising a testing component configured to determine a test case efficiency for at least one test case of the set of test cases, wherein the testing component is further configured to test one or more logic cones based on the test case efficiency of the at least one test case.

\* \* \* \* \*